United States Patent
Yu et al.

(10) Patent No.: US 8,022,531 B2
(45) Date of Patent: Sep. 20, 2011

(54) INTEGRATED CIRCUIT PACKAGE SYSTEM USING HEAT SLUG

(75) Inventors: Kyungsic Yu, Seoul (KR); Tae Keun Lee, Ichon-si (KR); Youngnam Choi, Seoul (KR)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 12/880,415

(22) Filed: Sep. 13, 2010

(65) Prior Publication Data

US 2010/0327418 A1 Dec. 30, 2010

Related U.S. Application Data

(62) Division of application No. 11/279,131, filed on Apr. 10, 2006, now Pat. No. 7,851,268.

(60) Provisional application No. 60/669,585, filed on Apr. 9, 2005.

(51) Int. Cl.
*H01L 23/34* (2006.01)
*H01L 23/10* (2006.01)

(52) U.S. Cl. ........ 257/706; 257/E23.101; 257/707; 257/712; 438/106; 438/122; 438/124

(58) Field of Classification Search ........ 257/E23.069, 257/E23.092, E23.101, E23.125, 706, 707, 257/675, 712, 713, 720, 722, 723; 438/106, 438/112, 119, 122, 124, 126, 127, 687
See application file for complete search history.

(56) References Cited

U.S. PATENT DOCUMENTS

| | | | | |
|---|---|---|---|---|
| 5,289,039 A * | 2/1994 | Ishida et al. | | 257/796 |
| 5,898,224 A | 4/1999 | Akram | | |
| 6,242,797 B1 | 6/2001 | Ichikawa et al. | | |
| 6,468,832 B1 | 10/2002 | Mostafazadeh | | |
| 6,541,310 B1 * | 4/2003 | Lo et al. | | 438/122 |
| 6,559,537 B1 | 5/2003 | Bolken et al. | | |
| 6,660,565 B1 | 12/2003 | Briar | | |
| 6,921,683 B2 * | 7/2005 | Nakayama | | 438/122 |
| 6,933,176 B1 * | 8/2005 | Kirloskar et al. | | 438/122 |
| 6,951,776 B2 * | 10/2005 | Lo et al. | | 438/122 |
| 6,963,141 B2 * | 11/2005 | Lee et al. | | 257/796 |
| 6,979,594 B1 * | 12/2005 | Fan et al. | | 438/113 |
| 7,259,445 B2 * | 8/2007 | Lau et al. | | 257/675 |
| 7,315,078 B2 | 1/2008 | Huang | | |
| 7,468,548 B2 | 12/2008 | Wu et al. | | |
| 2003/0011064 A1 * | 1/2003 | Combs et al. | | 257/706 |
| 2003/0062628 A1 | 4/2003 | Lee et al. | | |

* cited by examiner

*Primary Examiner* — Chris Chu
(74) *Attorney, Agent, or Firm* — Mikio Ishimaru (57) ABSTRACT

An integrated circuit package system includes a substrate having an integrated circuit die thereon; a heat slug having a tie bar, the tie bar having characteristics of singulation from an adjacent heat slug; and an encapsulant molded on the substrate, the heat slug, and the integrated circuit die includes the encapsulant which fills all of the space between the integrated circuit die and the heat slug.

10 Claims, 6 Drawing Sheets

INTEGRATED CIRCUIT PACKAGE SYSTEM USING HEAT SLUG

CROSS-REFERENCE TO RELATED APPLICATION(S)

This application is a divisional of U.S. patent application Ser. No. 11/279,131, now U.S. Pat. No. 7,851,268, filed Apr. 10, 2006, which claims the benefit of U.S. Provisional Patent Application Ser. No. 60/669,585 filed Apr. 9, 2005, and the subject matter thereof is hereby incorporated herein by reference thereto.

TECHNICAL FIELD

The present invention relates generally to methods and apparatus for the fabrication of integrated circuit packages, and more particularly to integrated circuit package systems using heat slugs.

BACKGROUND ART

In the electronics industry, the continuing goal has been to reduce the size of electronic devices such as camcorders and portable telephones while increasing performance and speed. Integrated circuit packages for complex systems typically are comprised of a multiplicity of interconnected integrated circuit dies. The integrated circuit dies usually are made from a semiconductor material such as silicon or gallium arsenide. Semiconductor devices are formed in the various layers of the integrated circuit dies using photolithographic techniques. The integrated circuit dies may be mounted in packages that are then mounted on printed wiring boards.

Recently, there has been rapid development in semiconductor technology and, as a result, semiconductors are becoming smaller, circuitry within semiconductors is becoming increasingly dense to provide higher speeds. As the density increases however, higher power is used in these semiconductor components. Higher power results in greater heat generation in such semiconductors. Thus, heat dissipation is becoming more critical as semiconductor technology develops to address the increasing demand for semiconductors having higher power and speed.

Various techniques may be used to remove or dissipate heat generated by an integrated circuit. One such technique involves the use of a mass of conductive material. The mass of conductive material typically is referred to as a heat slug. One of the primary purposes of a heat slug is to absorb and dissipate the heat generated by the electronic circuitry on the integrated circuit and to spread the heat away from the integrated circuit. The heat slug thereby removes the heat from the integrated circuit and reduces the likelihood of the occurrence of hot spots that can have an adverse effect on the performance and reliability of the integrated circuit.

Heat slugs are made of a thermally conductive material such as aluminum, electro-plated copper, copper alloy, or ceramic, for example.

An electronic device may comprise at least one integrated circuit including a heat slug and a substrate carrier. Passive electronic components such as capacitors also may be attached to the substrate carrier. Typically, the integrated circuit is attached to one side of the substrate carrier by means of a number of solder balls, solder bumps, or other alternative connections. The heat slug may be formed out of a suitable thermally conductive material such as copper, aluminum, carbon composites, or alternative suitable materials.

One problem with large heat slugs occurs during integrated circuit package sawing. While sawing a large heat slug, the saw blade can cause sawing stress and heat slug burr.

Consequently, there still remains a need for improved, more economical, more efficient, and more readily manufactured and assembled heat slugs, heat slug package systems, and fabrication methods for use with integrated circuit devices.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: a substrate having an integrated circuit die thereon; a heat slug having a tie bar, the tie bar having characteristics of singulation from an adjacent heat slug; and an encapsulant molded on the substrate, the heat slug, and the integrated circuit die includes the encapsulant which fills all of the space between the integrated circuit die and the heat slug.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention.

However, it will be apparent that the invention may be practiced without these specific details. In order to avoid obscuring the present invention, some well-known system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the FIGs. Also, where multiple embodiments are disclosed and described having some features in common, for clarity and ease of illustration and description thereof, like features one to another will ordinarily be described with like reference numerals.

The term "horizontal" as used herein is defined as a plane parallel to the conventional plane or surface of the substrate, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

The term "processing" as used herein includes deposition of material or photoresist, patterning, exposure, development, etching, cleaning, and/or removal of the material or photoresist as required in forming a described structure.

One method to improve thermal performance of an integrated circuit package is to use a heat slug having much higher thermal conductivity than the epoxy molding compound (EMC) used around the integrated circuit die. This type of integrated circuit package is often referred to as a thermally enhanced semiconductor package.

A problem with large heat slugs is during a package sawing. Heat slug sawing with a blade can cause sawing stress and heat slug burr. Thus, it has been discovered that a tie bar type heat slug in accordance with various aspects of the present invention will reduce the heat slug volume that needs to be sawn. The tie bar type heat slug provides low sawing stress, low burr and extends sawing blade life.

Figure 1:
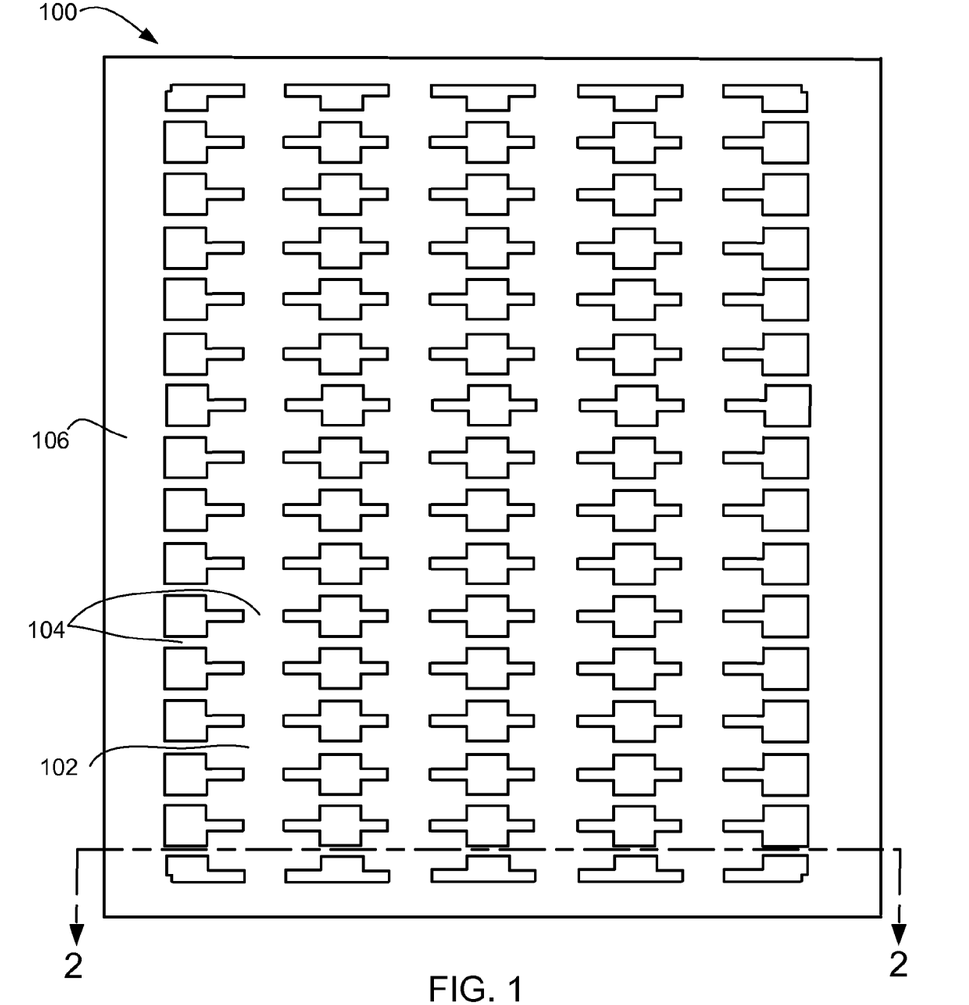
FIG. 1 is a plan view of a heat slug matrix manufactured in accordance with an embodiment of the present invention.

Referring now to FIG. 1, therein is shown a plan view of a heat slug matrix 100 manufactured in accordance with an embodiment of the present invention. The heat slug matrix 100 includes a number of main body portions 102. The main body portions 102 are connected by a number of tie bars 104. The periphery of the heat slug matrix 100 has a rail 106 connected to the tie bars 104 to form the heat slug matrix 100. The heat slug matrix 100 is formed of a thermally conductive material having a relatively high thermal conductivity as discussed below.

Figure 2:
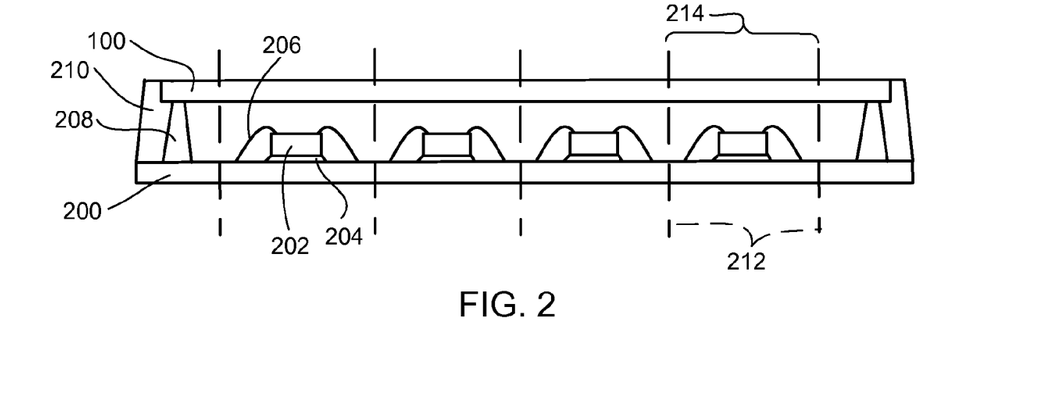
FIG. 2 is a cross-sectional view of FIG. 1 taken along line 2-2.

Referring now to FIG. 2, therein is shown a cross-sectional view of FIG. 1 taken along line 2-2 after forming an array of semiconductor packages 214. The array of semiconductor packages 214 is formed by providing a substrate 200, such as a printed circuit board (PCB) or other suitable substrate material. Each of the number of integrated circuit dies 202 is attached to the substrate 200 using a suitable adhesive layer 204. The integrated circuit dies 202 are wire bonded to the substrate 200 using a number of bond wires 206.

The heat slug matrix 100 is attached to the substrate 200 using a number of supports 208. The number of supports 208 is formed on the substrate 200, such as by using a suitable adhesive material. Typically, the height of the supports 208 is greater than the height of the bond wires 206 above the substrate 200. The heat slug matrix 100 is attached to the supports 208. The supports 208 support the heat slug matrix 100 during a molding process that forms an encapsulant 210 to completely fill all of the space between the heat slug 102, of FIG. 1, and the integrated circuit dies 202 leaving the top surface of the heat slug matrix 100 exposed.

It has been discovered that the height of the supports 208 may be adequately controlled by using an adhesive having a low modulus of elasticity and a high aspect ratio thereby reducing the possibility of crushing the supports 208 while attaching the heat slug matrix 100. The supports 208 can be formed by dotting the adhesive on the substrate 200.

A number of semiconductor package systems 214 is formed by a singulation process, such as sawing, along singulation lines 212 after the encapsulant 210 has adequately cured. It will be appreciated by those skilled in the art upon a reading of this disclosure that the singulation occurs in the area of the tie bars 104 of the heat slug matrix 100 shown in FIG. 1.

As discussed below with reference to FIGS. 3 through 6 and 9 through 12, the tie bars 104 have a reduced thickness compared to the main body portion 102. This provides less wear and tear on a saw blade, for example, used in the singulation process. Additionally, the singulation process can be performed more quickly since less material needs to be sawn.

The supports 208 are removed during the singulation process so no support is present in the semiconductor package systems 214.

Figure 3:
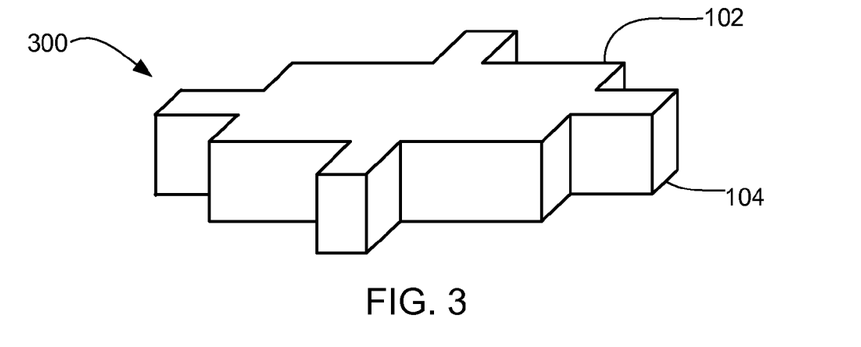
FIG. 3 is an isometric view of a heat slug manufactured in accordance with an embodiment of the present invention.

Referring now to FIG. 3, therein is shown an isometric view of a heat slug 300 manufactured in accordance with an embodiment of the present invention. The heat slug 300 includes the main body portion 102 and the number of tie bars 104 extending outwardly from the main body portion 102. In FIG. 3 there are four tie bars 104 each centrally located along one side of the main body portion 102. The tie bars 104 have substantially the same thickness as the main body portion 102 of the heat slug 300. A distance between a bottom surface of the tie bars 104 and a bottom surface of the heat slug 300 is equal to a distance between a top surface of the tie bars 104 and a top surface of the heat slug 300.

Figure 4:
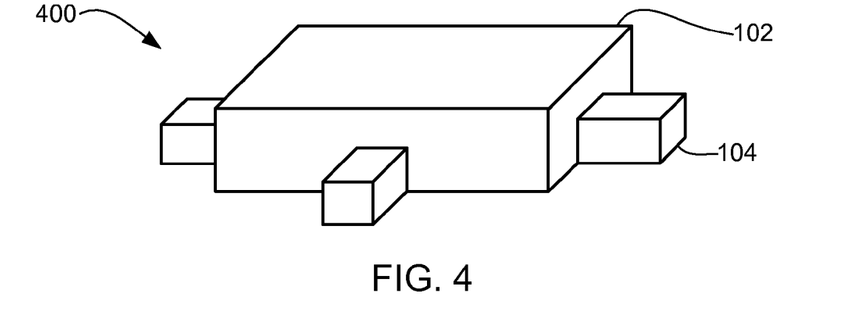
FIG. 4 is an isometric view of a heat slug manufactured in accordance with an embodiment of the present invention.

Referring now to FIG. 4, therein is shown an isometric view of a heat slug 400 manufactured in accordance with an embodiment of the present invention. The heat slug 400 includes the main body portion 102 and the number of tie bars 104 extending outwardly from the main body portion 102. In FIG. 4 there are four tie bars 104 each centrally located along one side of the main body portion 102. The tie bars 104 have a thickness equal to about half the thickness of the main body portion 102 of the heat slug 400 and are aligned with the lower surface of the main body portion 102. The thickness of the tie bars 104 is reduced by processing the tie bars 104 and etching away the upper half of the tie bars 104, such as by using a half etch process.

Figure 5:
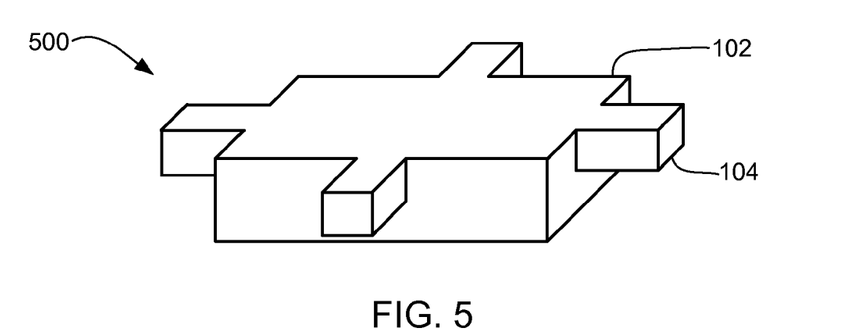
FIG. 5 is an isometric view of a heat slug manufactured in accordance with an embodiment of the present invention.

Referring now to FIG. 5, therein is shown an isometric view of a heat slug 500 manufactured in accordance with an embodiment of the present invention. The heat slug 500 includes the main body portion 102 and the number of tie bars 104 extending outwardly from the main body portion 102. In FIG. 5 there are four tie bars 104 each centrally located along one side of the main body portion 102. The tie bars 104 have a thickness equal to about half the thickness of the main body portion 102 of the heat slug 500 and are aligned with the upper surface of the main body portion 102. The thickness of the tie bars 104 is reduced by processing the tie bars 104 and etching away the lower half of the tie bars 104, such as by using a half etch process.

Figure 6:
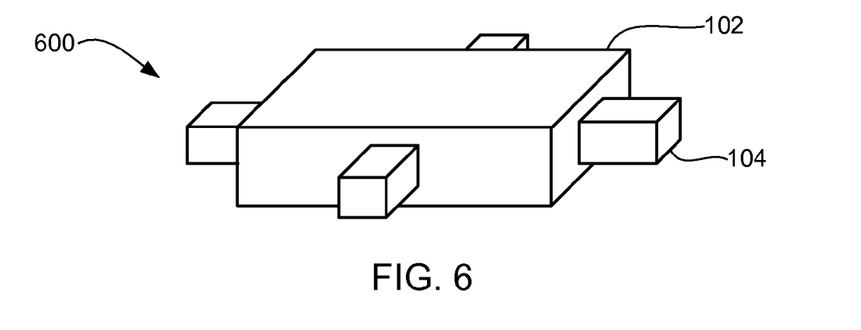
FIG. 6 is an isometric view of a heat slug manufactured in accordance with an embodiment of the present invention.

Referring now to FIG. 6, therein is shown an isometric view of a heat slug 600 manufactured in accordance with an embodiment of the present invention. The heat slug 600 includes the main body portion 102 and the number of tie bars 104 extending outwardly from the main body portion 102. In FIG. 6 there are four tie bars 104 each centrally located along one side of the main body portion 102. The tie bars 104 have a thickness equal to about half the thickness of the main body portion 102 of the heat slug 600 and are located in the middle portion of the sides of the main body portion 102. The thickness of the tie bars 104 is reduced by processing the tie bars 104 and etching away the upper and lower portions of the tie bars 104, such as by using a half etch process.

Figure 7:
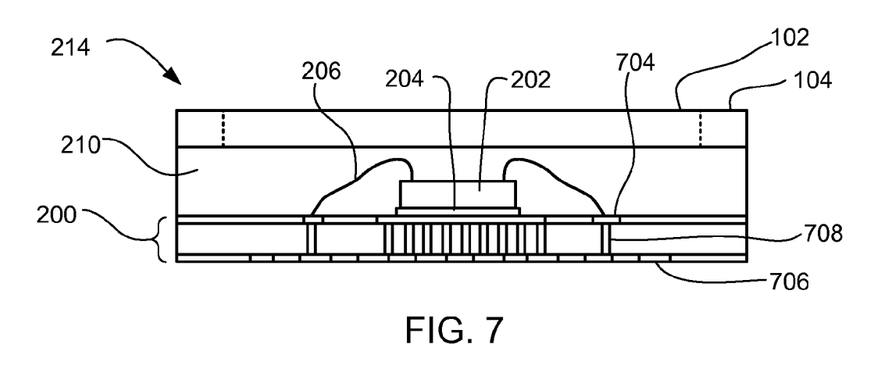
FIG. 7 is a cross-sectional view of an integrated circuit package system manufactured in accordance with an embodiment of the present invention.

Referring now to FIG. 7, therein is shown a cross-sectional view of an integrated circuit package system 214 manufactured in accordance with an embodiment of the present invention. The integrated circuit package system 214 includes the substrate 200. The substrate 200 typically includes a number of upper contacts 704 formed on the upper surface of the substrate 200 and a number of lower contacts 706 formed on the lower surface of the substrate 200. A number of vias 708 are formed through the substrate 200 to interconnect the upper contacts 704 and the lower contacts 706 as needed for a particular design.

The integrated circuit die 202 is attached to the substrate 200 using the adhesive layer 204. The integrated circuit die 202 is electrically connected to the upper contacts 704 using the bond wires 206. Any suitable wire bonding process, such as ultrasonic wire bonding, may be used to attach the bond wires 206 to the integrated circuit die 202 and the upper contacts 704 on the substrate 200.

Figure 8:
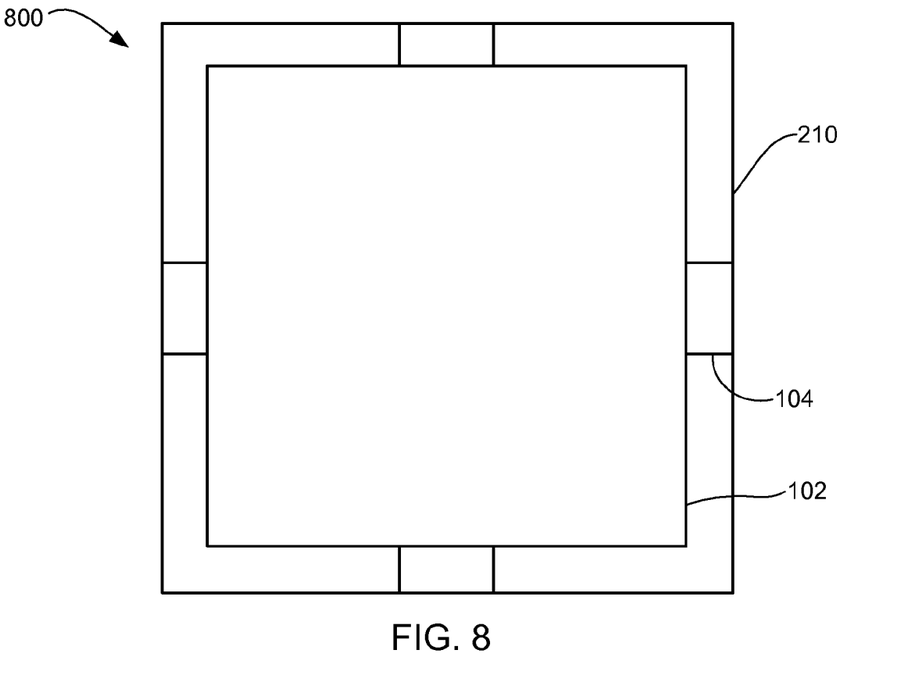
FIG. 8 is a top plan view of the structure of FIG. 7.

Referring now to FIG. 8, therein is shown a top plan view 800 of the structure of FIG. 7. The main body portion 102 covers substantially the entire surface of the substrate 200 with the exception of the area of the substrate 200 over which the tie bars 104 extend.

It also has been discovered that adhesive crushing or solder mask cracking can be accepted as long as crushed adhesive particles and solder mask cracking do not invade the final integrated circuit package system 214 interior of the supports 208. Thus, in the embodiments of the present invention, the supports 208 are located out of the final integrated circuit package systems 214 into an area that is trimmed during the package singulation or sawing process as discussed above.

It will be apparent to one skilled in the art upon a reading of this description that the heat slugs 300, 400, 500, and 600 shown in FIGS. 3, 4, 5, and 6 may be used to form the integrated circuit package system 214.

Figure 9:
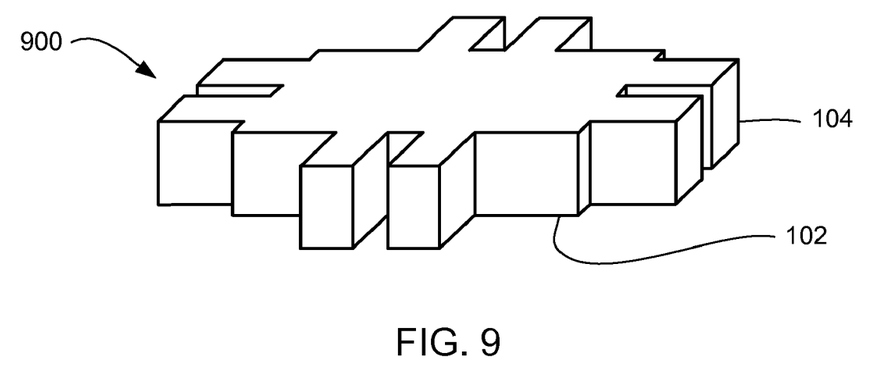
FIG. 9 is an isometric view of a heat slug manufactured in accordance with an embodiment of the present invention.

Referring now to FIG. 9, therein is shown an isometric view of a heat slug 900 manufactured in accordance with an embodiment of the present invention. The heat slug 900 includes the main body portion 102 and the number of tie bars 104 extending outwardly from the main body portion 102. In FIG. 9 there are eight tie bars 104. A pair of the number of tie bars 104 is centrally located along each side of the main body portion 102. The tie bars 104 have substantially the same thickness as the main body portion 102.

Figure 10:
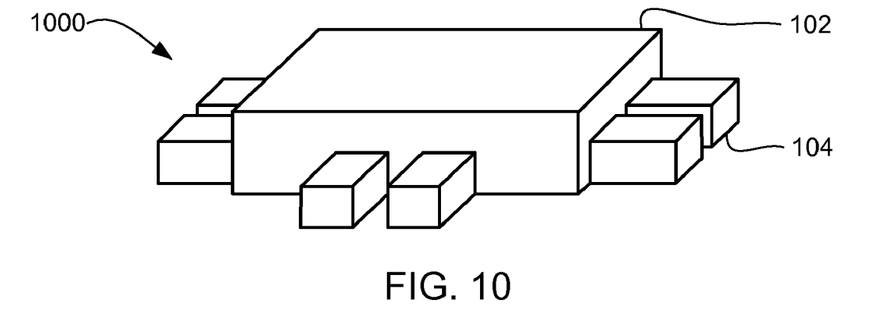
FIG. 10 is an isometric view of a heat slug manufactured in accordance with an embodiment of the present invention.

Referring now to FIG. 10, therein is shown an isometric view of a heat slug 1000 manufactured in accordance with an embodiment of the present invention. The heat slug 1000 includes the main body portion 102 and the number of tie bars 104 extending outwardly from the main body portion 102. In FIG. 10 there are eight tie bars 104. A pair of the plurality of tie bars 104 is centrally located along each side of the main body portion 102. The tie bars 104 have a thickness equal to about half the thickness of the main body portion 102 of the heat slug 1000 and are aligned with the lower surface of the main body portion 102. The thickness of the tie bars 104 is reduced by processing the tie bars 104 and etching away the upper half of the tie bars 104, such as by using a half etch process.

Figure 11:
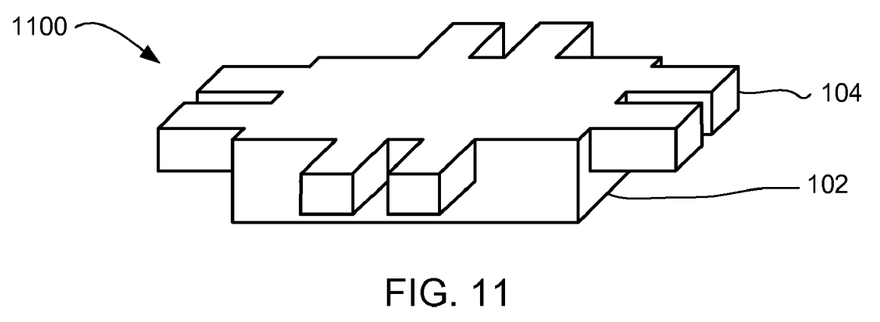
FIG. 11 is an isometric view of a heat slug manufactured in accordance with an embodiment of the present invention.

Referring now to FIG. 11, therein is shown an isometric view of a heat slug 1100 manufactured in accordance with an embodiment of the present invention. The heat slug 1100 includes the main body portion 102 and the number of tie bars 104 extending outwardly from the main body portion 102. In FIG. 11 there are eight tie bars 104. A pair of the plurality of tie bars 104 is located along each side of the main body portion 102. The tie bars 104 have a thickness equal to about half the thickness of the main body portion 102 of the heat slug 1100 and are aligned with the upper surface of the main body portion 102. The thickness of the tie bars 104 is reduced by processing the tie bars 104 and etching away the lower half of the tie bars 104, such as by using a half etch process.

Figure 12:
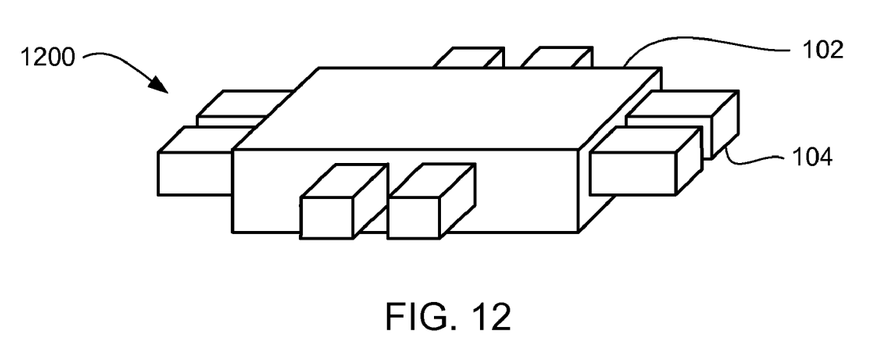
FIG. 12 is an isometric view of a heat slug manufactured in accordance with an embodiment of the present invention.

Referring now to FIG. 12, therein is shown an isometric view of a heat slug 1200 manufactured in accordance with an embodiment of the present invention. The heat slug 1200 includes a main body portion 102 and a number of tie bars 104 extending outwardly from the main body portion 102. In FIG. 12 there are eight tie bars 104. A pair of the plurality of tie bars 104 is located along each side of the main body portion 102. The tie bars 104 have a thickness equal to about half the thickness of the main body portion 102 and are located in the middle portion of the sides of the main body portion 102. The thickness of the tie bars 104 is reduced by processing the tie bars 104 and etching away the upper and lower portions of the tie bars 104, such as by using a half etch process.

Figure 13:
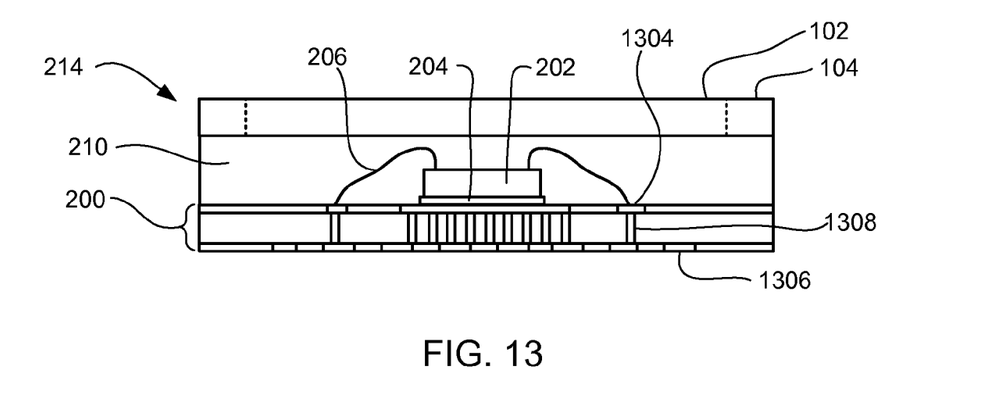
FIG. 13 is a cross-sectional view of an integrated circuit package system manufactured in accordance with an embodiment of the present invention.

Referring now to FIG. 13, therein is shown a cross-sectional view of an integrated circuit package system 214 manufactured in accordance with an embodiment of the present invention. The integrated circuit package system 214 includes the substrate 200. The substrate 200 typically includes a number of upper contacts 1304 formed on the upper surface of the substrate 200 and a number of lower contacts 1306 formed on the lower surface of the substrate 200. A number of vias 1308 is formed through the substrate 200 to interconnect the upper contacts 1304 and the lower contacts 1306 as needed for a particular design.

The integrated circuit die 202 is attached to the substrate 200 using the adhesive layer 204. The integrated circuit die 202 is electrically connected to the upper contacts 1304 using the number of bond wires 206. Any suitable wire bonding process, such as ultrasonic wire bonding, may be used to attach the bond wires 206 to the integrated circuit die 202 and the upper contacts 1304 on the substrate 200.

Figure 14:
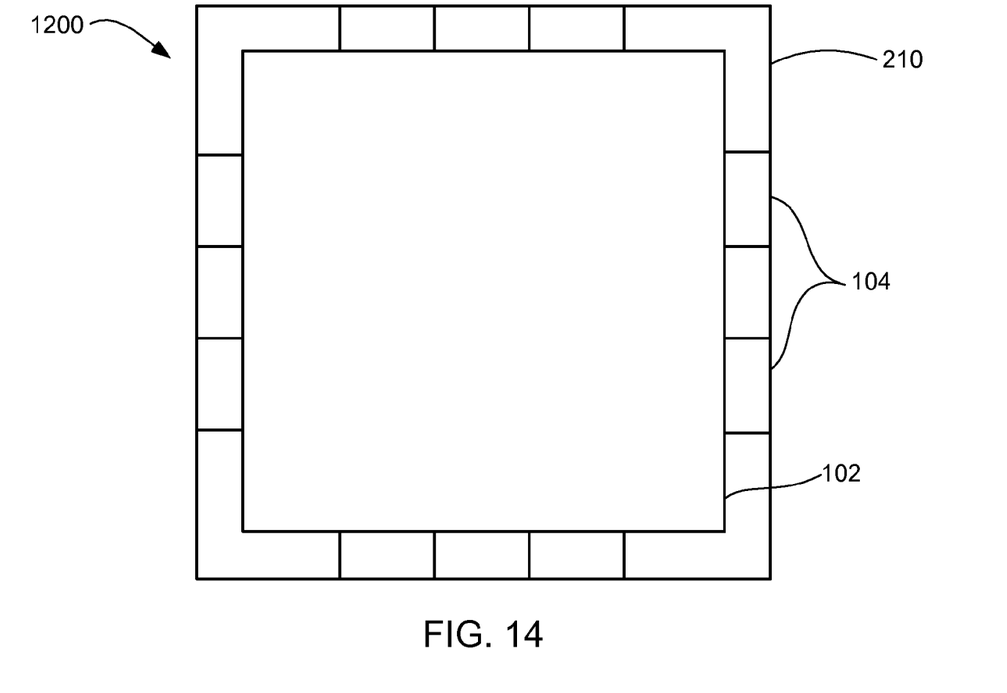
FIG. 14 is a top plan view of the structure of FIG. 13.

Referring now to FIG. 14, therein is shown a top plan view of the structure of FIG. 13. The main body portion 102 covers substantially the entire surface of the substrate 200 with the exception of the area of the substrate over which the tie bars 104 extend.

It will be apparent to one skilled in the art upon a reading of this description that the heat slugs 900, 1000, 1100, and 1200 shown in FIGS. 9, 10, 11, and 12 also may be used to form the integrated circuit package system 214.

Additionally, the number of tie bars 104 may be increased if additional support for the heat slug matrix 100 is needed in a particular integrated circuit package system. Also, it has been discovered that the integrated circuit package system of the present invention is compatible with both lead frame ball grid array (LFBGA) and quad flat pack non-leaded (QFN) integrated circuit packages.

The heat slug used for this invention is flat and has no supports that attach to the substrate in the integrated circuit package systems 214. A major advantage of using a flat heat slug is better thermal performance in comparison with conventional heat slugs that have supports because of increased exposed heat slug area.

Figure 15:
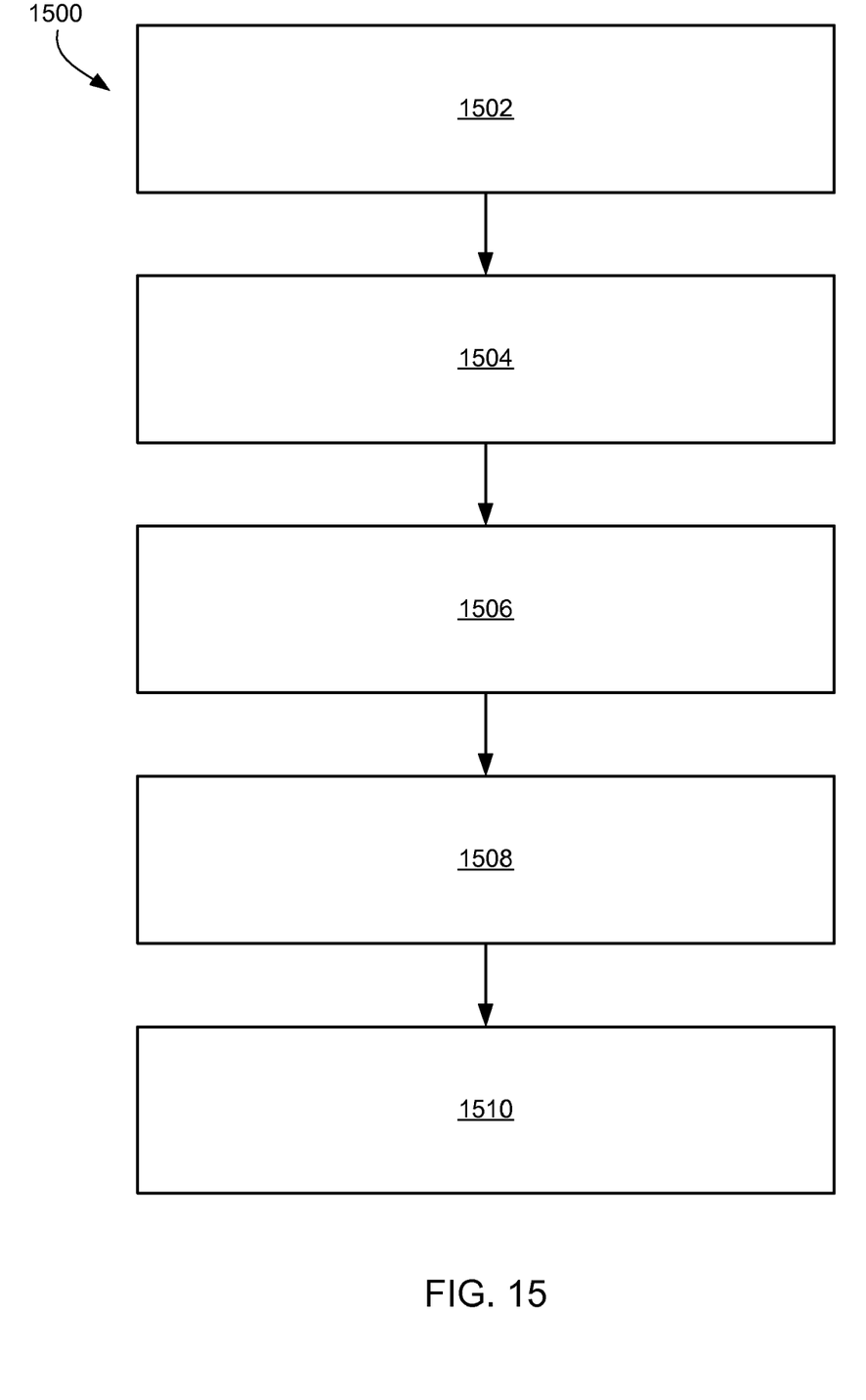
FIG. 15 is a flow chart of an integrated circuit package system in accordance with the present invention.

Referring now to FIG. 15, therein is shown a flow chart of an integrated circuit package system 1500 in accordance with the present invention. The integrated circuit package system 1500 includes providing a substrate having an integrated circuit die thereon in a block 1502; providing a support on the substrate in a block 1504; positioning a heat slug having a tie bar by the tie bar on the support in a block 1506; encapsulating the substrate and the integrated circuit with an encapsulant, the encapsulant in contact with the heat slug in a block 1508; and singulating the substrate, heat slug, and encapsulant to remove the support in a block 1510.

Thus, it has been discovered that the integrated circuit package system of the present invention furnishes important and heretofore unavailable solutions, capabilities, and functional advantages for packaging integrated circuits. The resulting process and configurations are straightforward, economical, uncomplicated, highly versatile and effective, use conventional technologies, and are thus readily suited for manufacturing integrated circuit devices that are fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. An integrated circuit package system comprising:
   a substrate having an integrated circuit die thereon;
   a heat slug having a tie bar, the tie bar having characteristics of singulation from an adjacent heat slug and a distance between a bottom surface of the tie bars and a bottom surface of the heat slug being equal to a distance between a top surface of the tie bars and a top surface of the heat slug; and
   an encapsulant molded on the substrate, the heat slug, and the integrated circuit die includes the encapsulant which fills all of the space between the integrated circuit die and the heat slug.

2. The integrated circuit package system as claimed in claim 1, wherein the heat slug, further comprises:
   a main body portion and a tie bar substantially centrally located along each side of the main body portion.

3. The integrated circuit package system as claimed in claim 1, wherein the heat slug, further comprises:
   a heat slug having a main body portion and a tie bar having a thickness of greater than about half the thickness of the main body portion.

4. The integrated circuit package system as claimed in claim 1, wherein the heat slug, further comprises:
   upper and lower surfaces; and
   a tie bar located at least one of flush with the upper surface of the heat slug, flush with the lower surface of the heat slug, and intermediate the upper and lower surfaces of the heat slug.

5. The integrated circuit package system as claimed in claim 1, wherein the heat slug, further comprises:
   a main body portion and a pair of tie bars located along each side of the main body portion.

6. The integrated circuit package system as claimed in claim 1, further comprising:
   a plurality of contacts on the substrate;
   wires bonding the integrated circuit die to the contacts;
   a heat slug having a plurality of tie bars slug and a distance between a bottom surface of the tie bars and a bottom surface of the heat slug being canal to a distance between a top surface of the tie bars and a top surface of the heat slug; and
   an encapsulant encapsulating the substrate and the integrated circuit with an encapsulant, the encapsulant in contact with the heat slug.

7. The integrated circuit package system as claimed in claim 6, wherein the heat slug, further comprises:
   a main body portion; wherein:
   each of the plurality of tie bars is substantially centrally located along each side of the main body portion.

8. The integrated circuit package system as claimed in claim 6, wherein the heat slug, further comprises:
   a main body portion; and
   the plurality of tie bars having a thickness of greater than about half the thickness of the main body portion.

9. The integrated circuit package system as claimed in claim 6, wherein the heat slug, further comprises:
   upper and lower surfaces; and wherein:
   the plurality of tie bars is located at least one of flush with the upper surface of the heat slug, flush with the lower surface of the heat slug, and intermediate the upper and lower surfaces of the heat slug.

10. The integrated circuit package system as claimed in claim 6, wherein the heat slug, further comprises:
    a main body portion and a pair of tie bars located along each side of the main body portion.

* * * * *

UNITED STATES PATENT AND TRADEMARK OFFICE
CERTIFICATE OF CORRECTION

| | | |
|---|---|---|
| PATENT NO. | : 8,022,531 B2 | Page 1 of 1 |
| APPLICATION NO. | : 12/880415 | |
| DATED | : September 20, 2011 | |
| INVENTOR(S) | : Yu et al. | |

It is certified that error appears in the above-identified patent and that said Letters Patent is hereby corrected as shown below:

Column 8:

claim 6, line 21, delete "being canal to a distance" and insert therefor --being equal to a distance--

Signed and Sealed this
Twenty-ninth Day of May, 2012

David J. Kappos
*Director of the United States Patent and Trademark Office*